(12) United States Patent
Takehara et al.

(10) Patent No.: US 6,815,810 B2
(45) Date of Patent: Nov. 9, 2004

(54) HIGH-FREQUENCY SEMICONDUCTOR DEVICE

(75) Inventors: Hideki Takehara, Kobe (JP); Noriyuki Yoshikawa, Ibaraki (JP); Kunihiko Kanazawa, Mukou (JP); Seiichi Nakatani, Hirakata (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/271,863

(22) Filed: Oct. 15, 2002

(65) Prior Publication Data

US 2003/0071350 A1 Apr. 17, 2003

(30) Foreign Application Priority Data

Oct. 17, 2001 (JP) ........................................ 2001-319019

(51) Int. Cl.[7] .......................... H01L 23/06; H01L 23/10; H01L 23/15; H01L 23/22; H01L 23/24; H01L 23/12; H01L 23/053; H01L 23/34
(52) U.S. Cl. ........................ 257/687; 257/728; 257/729; 257/700; 257/703; 257/705
(58) Field of Search ................................ 257/728, 729, 257/678, 687, 690, 691, 700, 701, 703, 705, 706, 717

(56) References Cited

U.S. PATENT DOCUMENTS

| 5,795,799 A | * | 8/1998 | Hosoya ...................... 438/126 |
| 5,831,833 A | | 11/1998 | Shirakawa et al. |
| 6,163,456 A | | 12/2000 | Suzuki et al. |
| 2002/0096759 A1 | * | 7/2002 | Hirano et al. ................ 257/706 |

FOREIGN PATENT DOCUMENTS

JP 2001-244688 9/2001

* cited by examiner

*Primary Examiner*—Nathan J. Flynn
*Assistant Examiner*—Victor A. Mandala
(74) *Attorney, Agent, or Firm*—Merchant & Gould P.C.

(57) ABSTRACT

A high-frequency semiconductor device is provided with a ceramic substrate, an element group including semiconductor elements and passive components mounted onto a bottom portion of the ceramic substrate, and a composite resin material layer formed on the bottom portion of the ceramic substrate so as to bury the element group. The composite resin material layer is formed by a composite resin material including an epoxy resin and an inorganic filler material, and has a flat bottom surface on which electrodes for connecting to the outside are formed. As packaging of a structure in which the receiving system and the transmitting system are formed in a single unit, such as an RF module, the high-frequency semiconductor device achieves a small size, a high mounting density, and excellent heat release properties.

3 Claims, 5 Drawing Sheets

HIGH-FREQUENCY SEMICONDUCTOR DEVICE

BACKGROUND OF THE INVENTION

1. Field of the Invention

The present invention relates to structures for high-frequency semiconductor devices on which high-frequency semiconductor elements, control integrated circuit elements, and surrounding circuits are mounted, and in particular to packaging structures thereof.

2. Description of the Related Art

There is an increasing demand for high-frequency semiconductor devices employed primarily in mobile communications equipment, such as portable telephones, as "all-in-one" RF modules with receiving and transmitting systems formed into a single unit. According to such situation, a need has arisen for a reduction in packaging size, under the condition that the number of semiconductor elements and chip components that are mounted increases due to the provision of high-frequency semiconductor elements, control integrated circuit elements and surrounding circuitry in order to incorporate receiving and transmitting systems into a single unit.

A conventional example of a high-frequency semiconductor device is described with reference to FIG. 10. In FIG. 10, numeral 1 denotes a semiconductor element of a chip form such as a transistor and 2 denotes a ceramic multilayer substrate. Numeral 3 denotes chip components such as chip resistors, chip capacitors, and chip inductors. Numeral 4 denotes bottom electrodes, 5 denotes metal wires, 6 denotes potting resin, and 7 denotes a metal cap.

Component mounting lands for mounting the semiconductor element 1 and the chip components 3 and an electrode wiring pattern (not shown) are formed on the surface of the ceramic multilayer substrate 2 through screen printing or metal thin film etching, for example. The semiconductor element 1 is die bonded to the component mounting land portion on the ceramic multilayer substrate 2, and connected to the electrode wiring pattern that is formed on the surface of the ceramic multilayer substrate 2 by the metal wires 5. The semiconductor element 1 and the metal wires 5 are covered by the potting resin 6. The chip components 3 are mounted to predetermined locations by soldering. The metal cap 7, which forms the packaging, is attached to the ceramic multilayer substrate 2. The electrode wiring pattern on the surface of the ceramic multilayer substrate 2 is connected electrically to the bottom electrodes 4 via through holes, which are not shown, that pass through the ceramic multilayer substrate 2.

However, with structures where semiconductor elements and chip components are simply mounted onto the ceramic multilayer substrate 2, as is the case with the conventional high-frequency semiconductor device described above, the desired reduction in the packaging size cannot be met sufficiently as the number of installed components increases.

Also, the semiconductor chip provided on the ceramic multilayer substrate is a heat-generating element such as a power amplifier, and thus all the heat generated from the semiconductor chip is transferred to the bottom portion via the ceramic multilayer substrate and released from the bottom portion electrodes. However, the ceramic multilayer substrate has a high thermal resistance. This led to the problem of not enough heat being released from the semiconductor chip, which consumes a large amount of power, and the semiconductor chip becoming hot.

SUMMARY OF THE INVENTION

It is an object of the present invention to provide a high-frequency semiconductor device in which receiving and transmitting systems including active elements such as semiconductor elements like power amplifiers and switches or semiconductor elements for control, and passive components such as resistors, capacitors, inductors, and filters, are mounted as a single unit in a layered substrate, so as to improve electrical properties by reducing impedance due to the reduction in the wiring length, reducing the floating capacity, and improving anti-noise properties, and to provide a smaller size device with improved heat release properties.

A high-frequency semiconductor device of the present embodiment is provided with a ceramic substrate, an element group including semiconductor elements and passive components mounted onto a bottom portion of the ceramic substrate, and a composite resin material layer formed on the bottom portion of the ceramic substrate so as to bury the element group. The composite resin material layer is formed of a composite resin material including an epoxy resin and an inorganic filler material, and has a flat bottom surface on which electrodes for connecting to the outside are formed.

With this configuration, the semiconductor elements and passive components are mounted on the bottom portion of the ceramic substrate, so that the bottom surface of the substrate can be utilized as the mounting area and the mounting density can be increased. Also, by burying the element group in the composite resin material layer, an increase in reliability, such as mechanical resistance and resistance against moisture, can be achieved. Moreover, by making the bottom surface of the composite resin material layer flat and providing the electrodes for connecting to the outside, the product is easily transported and handled, and the ability to mount the high-frequency semiconductor device as a module is improved.

It is preferable that the semiconductor elements are mounted by flip-chip connection. Thus, a drop in impedance due to the reduction in wiring length, a reduction in the floating capacity, an increase in the mounting density, and reduction in the height of the packaging can be achieved.

The high-frequency semiconductor device mentioned above can be given a structure where interlayer connector structures are formed in the composite resin material layer, the interlayer connector structures being filled with a high thermal conductivity resin material having thermal conductivity higher than that of the epoxy resin, the electrodes for connecting to the outside include a ground electrode that functions as a heat release electrode, and the surface of the semiconductor element is connected to the ground electrode via the interlayer connector structures. Thus, heat generated by the semiconductor elements, which are heat-generating elements such as power amplifiers and mounted by flip-chip connection, can be adequately released from the electrodes for connecting to the outside via the interlayer connector structures provided in a single or a plurality of locations.

Another high-frequency semiconductor device of the present invention is provided with a first ceramic substrate having a circuit pattern, a second ceramic substrate on which semiconductor elements are mounted, and a composite resin material layer that buries the semiconductor elements and is provided between the first ceramic substrate and the second ceramic substrate. The composite resin material layer is formed by a composite resin material including an epoxy resin and an inorganic filler material, interlayer connector structures in which a conducting resin material has been filled are formed in the composite resin material layer, and the circuit pattern of the first ceramic substrate and a circuit pattern of the second ceramic substrate are electrically connected via the interlayer connector structures.

According to this configuration, the first ceramic substrate and the second ceramic substrate are employed according to the electrical, thermal, and mechanical properties that are required, and are deposited with the composite resin layer interposed between them, so that a small size substrate packaging can be formed. Even if the linear expansion coefficients of the first ceramic substrate and the second ceramic substrate are different, a highly reliable packaging that absorbs this difference can be provided, because the composite resin layer is interposed between the substrates. In addition to the fact that semiconductor elements and passive component can be mounted between the first ceramic substrate and the second ceramic substrate, it is also possible to mount components on the upper surface of the first substrate, and thus the overall mounting density of the product can be increased. Moreover, by burying the semiconductor elements, for example, with the composite resin, reliability such as mechanical resistance and resistance against moisture can be increased.

In this configuration, it is preferable that the semiconductor elements provided on the second ceramic substrate have been mounted by flip-chip connection. Thus, the thickness of the composite resin material layer between the first ceramic substrate and the second ceramic substrate can be reduced. Also, a drop in impedance due to the reduction in wiring length, a reduction in the floating capacity, an increase in the mounting density, and a reduction in the packaging height can be achieved.

Additionally, it is possible to adopt a configuration in which at least one of the semiconductor elements provided on the second ceramic substrate is connected by metal wires. Thus, those elements of the semiconductor elements that are mounted onto the second ceramic substrate for which the release of heat is required can be adhered by a high conductivity adhesive agent and connected to the substrate by the metal wire, so that heat can be dissipated from those elements directly to the second ceramic substrate. This configuration is particularly effective when a large amount of heat is generated by the semiconductor elements.

In this configuration, the surroundings of the semiconductor elements provided on the second ceramic substrate and connected by the metal wire can be sealed by a liquid epoxy resin. Thus, stress that is applied to the semiconductor elements and the metal wire when the first ceramic substrate and the second ceramic substrate are adhered by the composite resin material can be alleviated, so that defects such as the wire falling over or being disconnected can be eliminated, and the assembly yield can be increased. Moreover, the epoxy resin that seals the semiconductor elements can be employed as a spacer for the first ceramic substrate and the second ceramic substrate, so that the gap between the two substrates can be adjusted.

A further high-frequency semiconductor device according to the present invention is provided with a ceramic substrate having a cavity portion in its bottom portion, an element group including semiconductor elements and passive components mounted to the bottom portion of the cavity portion, a composite resin material layer formed so as to bury the element group in the cavity portion, and electrodes for connecting to the outside that are formed on a bottom portion of the ceramic substrate other than at the cavity portion. The composite resin material layer is formed by a composite resin material including an epoxy resin and an inorganic filler material, and a bottom portion of the composite resin material layer is flat in shape.

As in the configuration mentioned above, this configuration achieves an increase in the mounting density, an increase in device reliability such as in the mechanical resistance and in the resistance against moisture, and an increase in mountability. Additionally, the composite resin material layer can easily be formed by filling a composite resin material into the cavity portion.

DESCRIPTION OF THE PREFERRED EMBODIMENTS

First Embodiment

Figure 1:
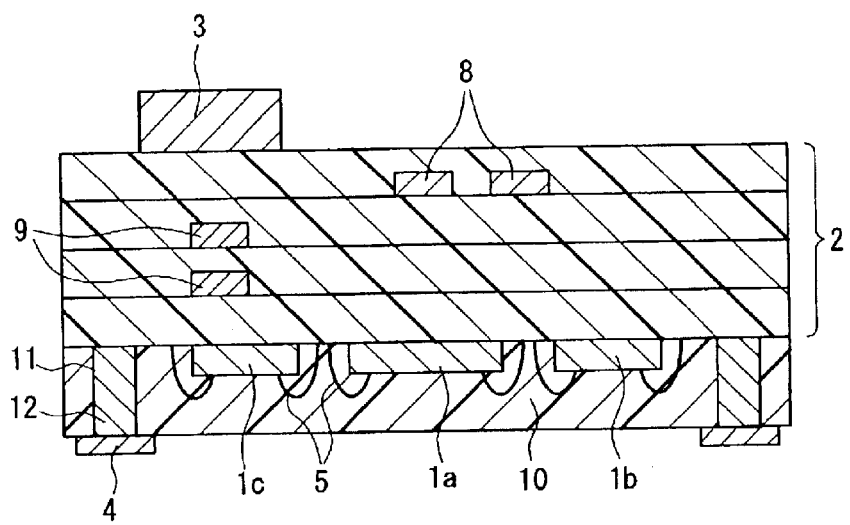
FIG. 1 is a cross-sectional view showing a high-frequency semiconductor device according to Embodiment 1 of the invention.
Figure 2:
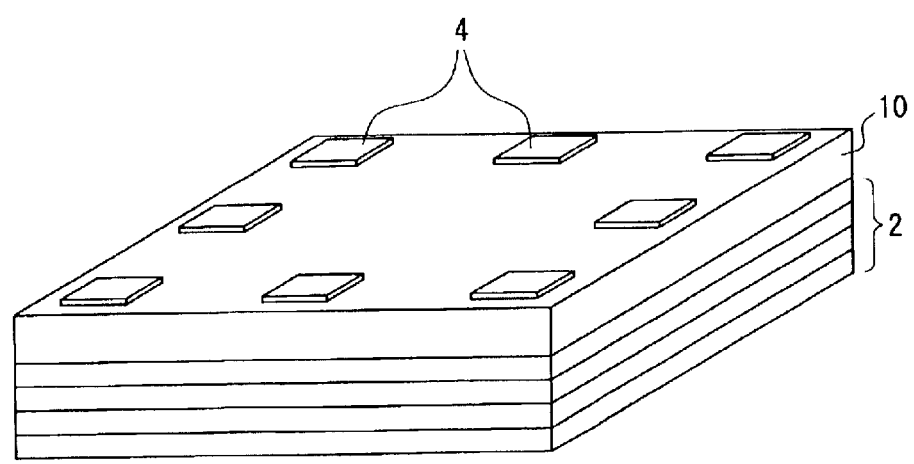
FIG. 2 is a perspective view of the high-frequency semiconductor device of FIG. 1 seen from its rear side.

FIG. 1 is a cross-sectional view of a high-frequency semiconductor device according to Embodiment 1 of the present invention. FIG. 2 is a perspective view of the high-frequency semiconductor device of FIG. 1 seen from its rear side.

In FIG. 1, the numeral 1a denotes a gallium-arsenide power semiconductor element serving as a power amplifier, 1b denotes a gallium-arsenide semiconductor element serving as a switching element, and 1c denotes a silicon semiconductor element for circuit control. Numeral 2 denotes a non-shrinkage ceramic multilayer substrate, which incorporates in its inner layers printed resistors 8 and printed capacitors 9 formed by printing a paste material that includes metal, and which may be formed by baking at a low temperature. Numeral 3 denotes a chip component such as, for example, a chip capacitor for fine-tuning the high-frequency circuit constants. Numeral 5 denotes metal wires, and 10 denotes a composite resin material layer including an epoxy resin and an inorganic filler such as silica. Numeral 4 denotes electrodes for connecting to the outside which may be made of a conductor formed on the bottom surface of the composite resin material layer 10. Numeral 11 denotes a plurality of interlayer connector via holes formed in the composite resin material layer 10 and functioning as an interlayer connector structure, and numeral 12 denotes a conducting resin buried in each interlayer connector via hole 11.

Although not shown in the drawings, an electrode wiring pattern and a component mounting land for mounting the chips of the semiconductor elements 1a, 1b, and 1c and the chip component are formed on the bottom surface of the ceramic multilayer substrate 2 by screen printing or metal thin film etching. The gallium-arsenide power semiconductor element 1a, the gallium-arsenide semiconductor element 1b, and the silicon semiconductor element 1c may be die bonded to the component mounting land portion on the bottom surface of the ceramic multilayer substrate 2 by soldering, for example, and are connected with the metal wires 5 to the electrode wiring pattern that is formed on the bottom surface of the ceramic multilayer substrate 2. In addition, although not shown in the drawings, a plurality of passive components such as chip resistors, chip capacitors, and chip inductors may be fastened and connected by soldering or the like to the circuit pattern that is formed on the bottom surface of the ceramic multilayer substrate 2.

The chip dimensions of the semiconductor elements 1a, 1b, and 1c are ordinarily 1.6 mm×0.6 mm and 100 $\mu$m thickness for the power amplifier element; 0.8 mm×0.6 mm and 150 $\mu$m thickness for the switching element; and 1.0 mm×0.7 mm and 300 $\mu$m thickness for the control element.

The semiconductor elements 1a, 1b, 1c and the passive elements are buried by the composite resin material layer 10. As shown in FIG. 2, the bottom portion of the composite resin material layer 10 is flat and serves as a flat electrode surface. Moreover, as shown in FIG. 1, the plurality of the interlayer connector via holes 11 are formed in the composite resin material layer 10, and conducting resin 12 is filled into the interlayer connector via holes 11. The interlayer connector via holes 11 match the position of the electrodes 4 for connecting to the outside.

The interlayer connector via holes 11 act both to contact the circuit pattern that is formed on the bottom surface of the ceramic multilayer substrate 2 with the electrodes 4 for connecting to the outside, and to release heat that is generated by the semiconductor elements 1a, 1b, and 1c via the ceramic multilayer substrate 2. The via holes may have a diameter of 200 $\mu$m$\phi$ and are filled with a copper-based paste serving as the conducting resin 12. An electrode wiring pattern may be formed on the upper surface of the ceramic multilayer substrate 2, and a plurality of chip components 3, such as chip resistors, chip capacitors, and chip inductors, may be fastened and connected to the electrode pattern on the upper surface by soldering or the like.

The high-frequency circuit constant is determined by the passive elements that are buried by the composite resin material 10 and the printed resistors 8 and the printed capacitors 9, which are formed between the layers of the ceramic multilayer substrate 2, and the high-frequency circuit constant is fine-tuned at each high-frequency semiconductor device with the chip components 3 that are connected to the upper surface of the ceramic multilayer substrate 2. Also, although not shown in the drawings, the electrode pattern formed on the upper surface of the ceramic multilayer substrate 2, the printed resistors 8, the printed capacitors 9, the electrode pattern formed between the layers of the ceramic multilayer substrate 2, and the electrode pattern formed on the bottom surface of the ceramic multilayer substrate 2 are electrically connected to one another via through holes that pass through the ceramic multilayer substrate 2, as appropriate.

The thickness of the composite resin material layer 10 is determined by the height of the semiconductor elements and the passive components that are mounted. Here, this value can be slightly above or below the standard for the thickness at the semiconductor elements 1a, 1b, and 1c, which is the wire loop height of the metal wire 5 plus 300 $\mu$m, or the standard for the thickness at the passive components, which is the component height plus 300 $\mu$m.

The ceramic multilayer substrate 2 can be formed by using an alumina substrate (high temperature cofired ceramics (HTCC) substrate), a low temperature cofired ceramics (LTCC) substrate, and so on. Generally, the "alumina substrate" means the HTCC substrate. Both of them contain alumina as a main component and the content thereof is higher in HTCC than in LTCC. Cofiring temperature is 1300° C. to 1500° C. for HTCC and 800° C. to 900° C. for LTCC.

The composite resin material layer 10 may be formed by using, for example, a sheet obtained by mixing epoxy resin with 70 to 80% by weight of an inorganic filler material (mainly silica), coupling agent, pigment, solvent, etc., kneading them, and forming into a sheet with uniform thickness. The coupling agent adheres to the inorganic filler material and increases wettability of the inorganic filler material with respect to the epoxy resin. In order to couple the composite resin material layer 10 to the ceramic multilayer substrate 2 as shown in FIGS. 1 and 2, the composite resin material layer 10 is superposed on the ceramic multilayer substrate 2 with chips mounted and they are subjected to hot-pressing to be formed.

The composite resin material layer 10 may be formed also by using a solventless sheet in which a solvent is not added. In such case the sheet is made of a liquid epoxy resin with an inorganic filler material (mainly silica) added.

As the conducting resin 12, Ag paste (adhesive resin with silver added as a filler) may be used generally. The composite resin material layer 10 is subjected to punching to form holes and then Ag paste is filled into the holes by a printing method. When the composite resin material layer 10 and the ceramic multilayer substrate 2 with chips mounted are superposed with each other and subjected to hot-pressing to be formed, Ag paste is cured together with the composite resin material layer 10. Also Cu paste may be used as the conducting resin 12. However it is oxidized easily compared to Ag paste.

In the foregoing description, silica was used as an example of the inorganic filler for the composite resin material layer 10, but the filler material can be chosen according to properties that are required. For example, if high heat-release properties are required, then alumina can be used as the filler material, which would permit adequate heat release.

The electrodes 4 for connecting to the outside that are formed on the rear surface of the composite resin material layer 10 have a flat rear surface, and thus as a module, the high-frequency semiconductor device easily can be transported and handled during manufacturing and installed by the user.

Embodiment 2

Embodiment 2 of the present invention is described with reference to the cross-sectional view of the high-frequency semiconductor device shown in FIG. 3.

Figure 3:
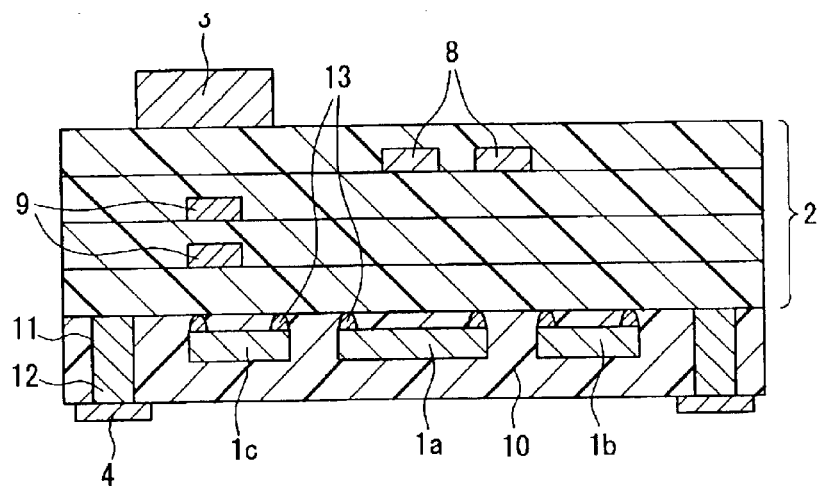
FIG. 3 is a cross-sectional view showing a high-frequency semiconductor device according to Embodiment 2 of the invention.

The device of FIG. 3 differs from that according to Embodiment 1 shown in FIG. 1 in that the gallium-arsenide power semiconductor element 1a, the gallium-arsenide semiconductor element 1b, and the silicon semiconductor element 1c are flip-chip connected on the circuit pattern on the bottom surface of the ceramic multilayer substrate 2 via bumps 13 having a metal core.

The bumps 13 are formed through SBB (stud ball bonding) using gold wire, and maintain a gap of approximately 40 μm between the semiconductor elements 1a, 1b, and 1c and the ceramic multilayer substrate 2. Other techniques that can be employed to provide the bumps 13 include a technique employing plating around a copper core material serving as the core and adhering with a conductive resin, a technique employing an ACF (anisotropic conductive film), and a technique employing a soldering material. Any of these techniques can be employed to achieve the same effect. Compared to the case in which the semiconductor elements 1a, 1b, and 1c are fastened to the substrate and they are connected by the metal wire, the height after installation can be reduced by approximately one half. In this embodiment, the standard for the thickness of the composite resin material layer 10 after sealing is the chip height plus 300 μm.

When the semiconductor elements are flip-chip mounted onto the bottom surface of the ceramic substrate in this way, they can be disposed in closer proximity to one another than when connected on the substrate via metal wiring, and components can be installed on the upper surface of the substrate as well, so that the installation density of the entire product is increased.

Moreover, electrical property effects such as a lower impedance due to the reduced wiring length and a reduction in the floating capacity also may be achieved.

Embodiment 3

Figure 4:
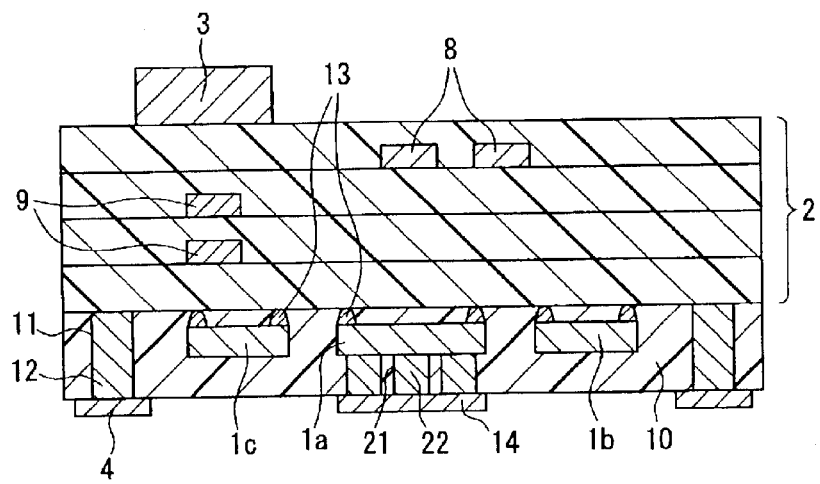
FIG. 4 is a cross-sectional view showing a high-frequency semiconductor device according to Embodiment 3 of the invention.
Figure 5:
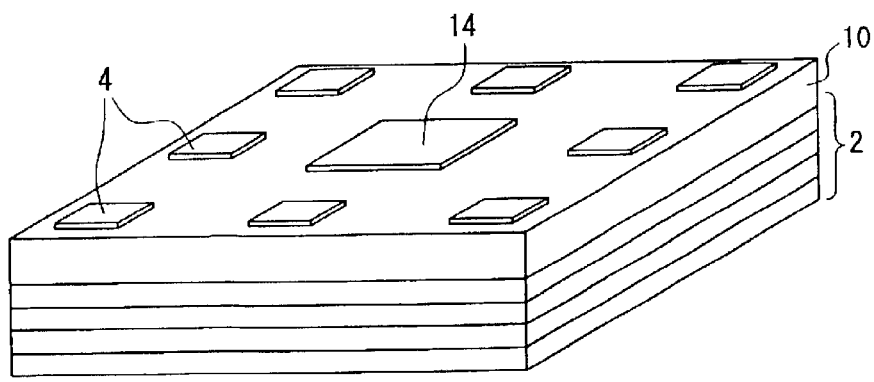
FIG. 5 is a perspective view of the high-frequency semiconductor device of FIG. 4 seen from its rear side.

Embodiment 3 of the invention is described in reference to the cross-sectional view of the high-frequency semiconductor device shown in FIG. 4 and the perspective view of the device of FIG. 4 seen from its rear side shown in FIG. 5.

The device of FIG. 4 differs from that according to Embodiment 2 shown in FIG. 3 in that interlayer connector via holes 21 are formed directly below the gallium-arsenide power semiconductor element 1a, which is a power amplifier, and a heat-release electrode 14 is formed on the bottom surface of the composite resin material layer 10 in alignment with the positions of the interlayer connector via holes 21. As shown in FIG. 5, a plurality of electrodes 4 for connecting to the outside and the heat release electrode 14, which has a larger area than the electrodes 4 for connecting to the outside, are formed on the bottom surface of the composite resin material layer 10. Accordingly, heat can be released effectively from the electrode of the gallium-arsenide power semiconductor element 1a via the interlayer connector via holes 21. The heat release electrode 14 also serves as a ground electrode, and suitably grounds the high-frequency semiconductor element to the ground potential.

The diameter of the interlayer connector via holes 21 can be suitably chosen within a range of 150 μmφ to 500 μm φ. A single or a plurality of via holes 21 can be formed in correspondence with the chip size of the gallium-arsenide power semiconductor element 1a. In one example, a high thermal conductivity resin 22 is filled into the via holes 21. The high thermal conductivity resin 22 has thermal conductivity higher than that of epoxy resin. Similar effects can also be achieved by filling into the via holes 21 the conductive resin 12 that is used in the interlayer connector via holes 11.

One example of the high thermal conductivity resin 22 is composed of epoxy resin with 80 to 90% by weight of alumina added as a filler. Thermal conductivity thereof is more than 3 W/m·K. It may be filled into the via holes 21 formed in the composite resin material layer 10 by a printing method.

According to this embodiment, when the semiconductor element is a flip-chip mounted power device that generates a large amount of heat, the heat from the semiconductor can be suitably dissipated.

Embodiment 4

Embodiment 4 of the present invention is described with reference to the cross-sectional view of the high-frequency semiconductor device shown in FIG. 6. The high-frequency semiconductor device according to this embodiment has a structure in which the ceramic multilayer substrate 2 (first substrate) and an alumina substrate 32 (second substrate) sandwich the composite resin material layer 10, and in this state are adhered to one another to form a single unit.

The ceramic multilayer substrate 2 may be a non-shrinkage substrate formed through baking at low temperatures, and incorporates in its inner layers a printed resistor 8 and printed capacitors 9 formed by printing a paste material that includes metal. The alumina substrate 32 is a substrate on which gallium-arsenide semiconductor elements 1a and 1b, such as power amplifiers and switches, and a silicon semiconductor element 1c for circuit control have been flip-chip mounted.

Via holes 11 for electrically connecting the ceramic multilayer substrate 2 and the alumina substrate 32 are formed in the composite resin material layer 10, and the conducting resin 12 is filled into the via holes 11. The via holes 11 may have a diameter of 200 μm and are filled with a copper-based paste. Although not shown, through holes are provided in the alumina substrate 32 so as to electrically connect the electrodes 4 for connecting to the outside and the heat release electrode 14 to the electrode pattern on the surface of the alumina substrate 32.

Thus, by using the composite resin material layer 10 to adhere the plurality of substrates 2 and 32, the problem of peeling, for example, due to differences in the linear expansion coefficient is eliminated, and because the semiconductor elements 1a, 1b, and 1c are included in the adhesion layer, the component mounting density, the mechanical resistance, and the resistance against moisture are improved.

Embodiment 5

Figure 7:
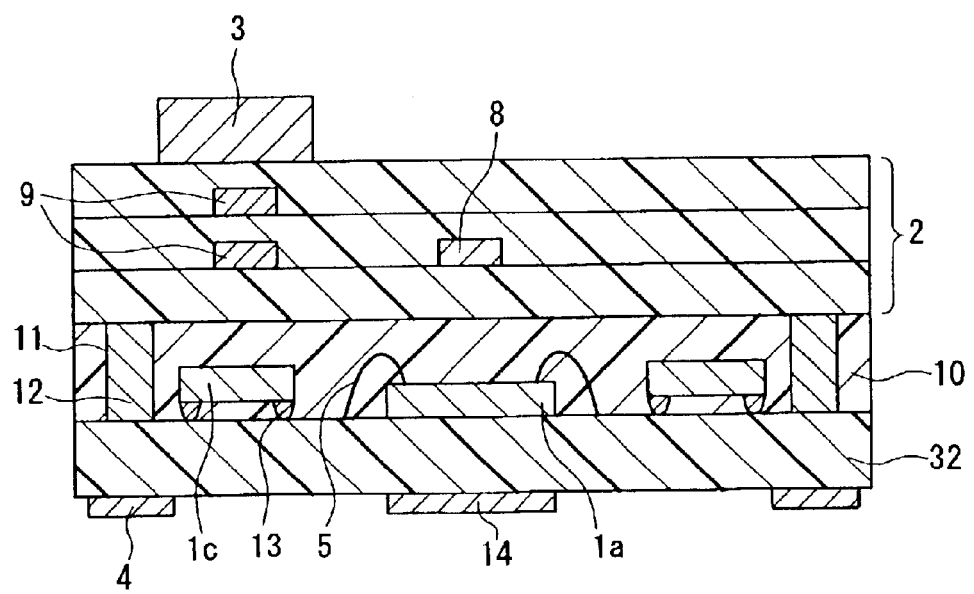
FIG. 7 is a cross-sectional view showing a high-frequency semiconductor device according to Embodiment 5 of the invention.

Embodiment 5 of the present invention is described in reference to the cross-sectional view of the high-frequency semiconductor device shown in FIG. 7.

Figure 6:
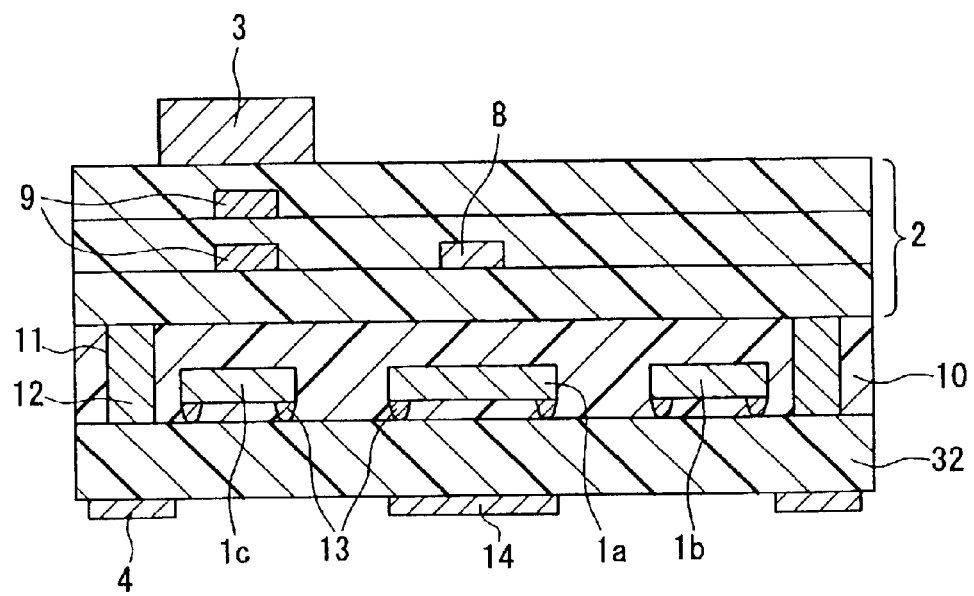
FIG. 6 is a cross-sectional view showing a high-frequency semiconductor device according to Embodiment 4 of the invention.

The device in FIG. 7 differs from that according to Embodiment 4 shown in FIG. 6 in that, of the semiconductor elements that are provided on the alumina substrate 32, the gallium-arsenide power semiconductor element 1a, which is for example a power amplifier and requires the release of heat, is adhered by a high thermal conductivity adhesive agent (not shown), and is connected to the alumina substrate 32 by the metal wire 5. Thus, heat can be released from the gallium-arsenide power semiconductor element 1a directly to the alumina substrate 32. Adhering the element directly onto the alumina substrate 32 results in a large heat transfer effect, and the further effect of releasing heat via the metal wire 5 can be observed. This embodiment is particularly effective when a large amount of heat is generated by an element.

Embodiment 6

Figure 8:
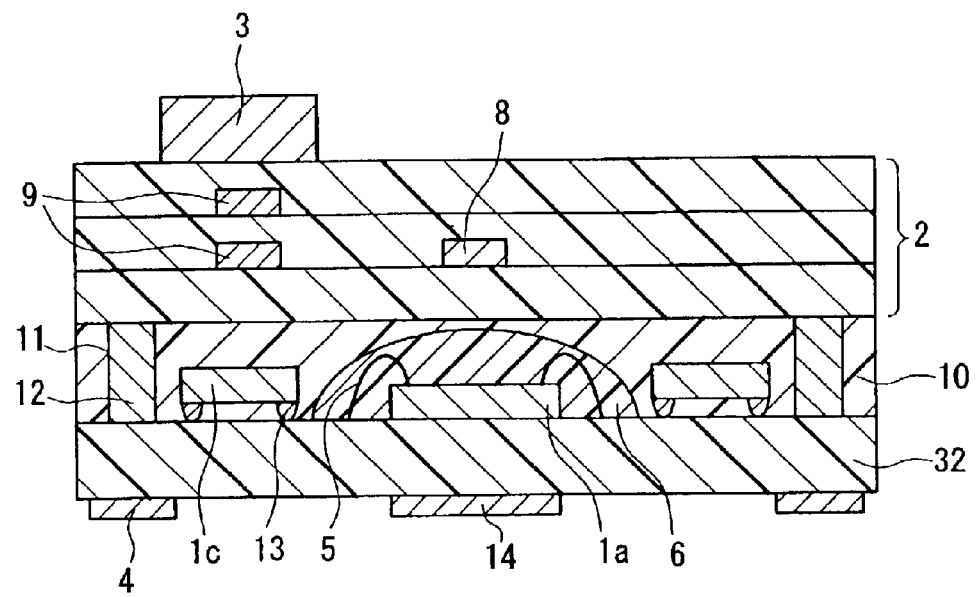
FIG. 8 is a cross-sectional view showing a high-frequency semiconductor device according to Embodiment 6 of the invention.

Embodiment 6 of the present invention is described in reference to the cross-sectional view of a high-frequency semiconductor device shown in FIG. 8. The device of FIG. 8 differs from that according to Embodiment 5 shown in FIG. 7 in that before the ceramic multilayer substrate 2 and the alumina substrate 32 are adhered via the composite resin material layer 10, the circumference of the gallium-arsenide power semiconductor element 1a and the metal wire 5 for connection that are disposed on the alumina substrate 32 is sealed by a liquid epoxy resin 6.

The amount of epoxy resin 6 can be enough to entirely cover the power semiconductor element 1a and the metal wire 5, and considering the resin spread when the epoxy resin 6 is cured, a highly thixotropic resin can be chosen as the epoxy resin 6. Thus, when the ceramic multilayer substrate 2 and the alumina substrate 32 are adhered via the composite resin material layer 10, the stress to the semiconductor element 1a and the metal wire 5 can be alleviated, so that defects such as the metal wire falling down or being disconnected are avoided and the assembly yield can be increased. Also, the epoxy resin 6 for sealing the semiconductor element 1a can be utilized as a spacer between the ceramic multilayer substrate 2 and the alumina substrate 32, so that the gap between these substrates can be adjusted.

Embodiment 7

Figure 9:
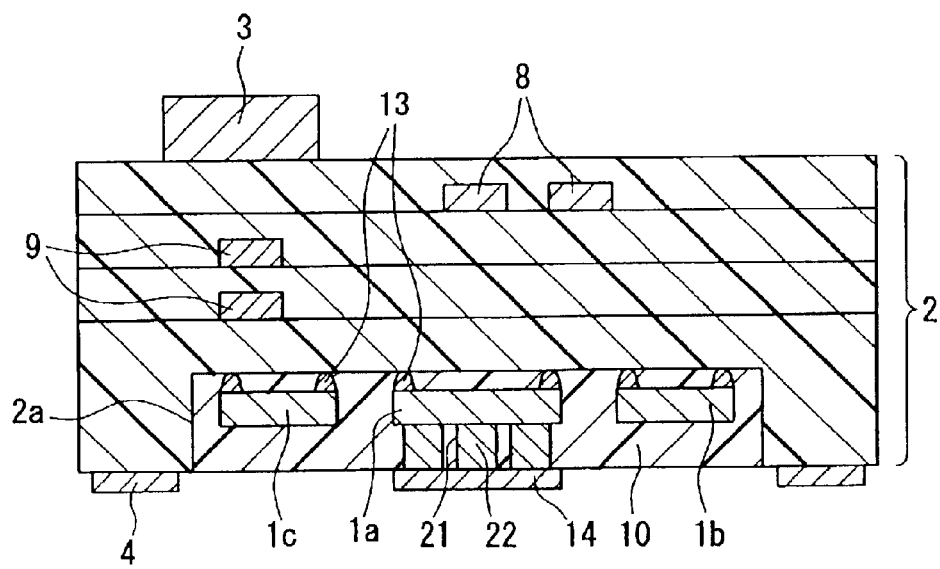
FIG. 9 is a cross-sectional view showing a high-frequency semiconductor device according to Embodiment 7 of the invention.
Figure 10:
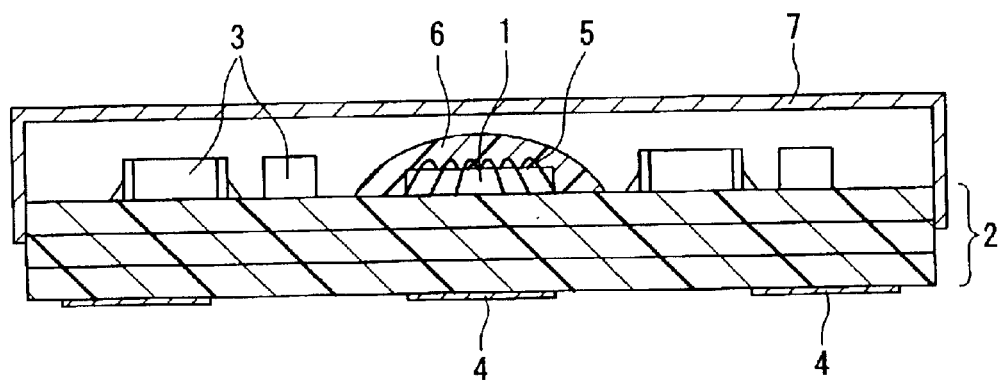
FIG. 10 is a cross-sectional view showing a conventional example of a high-frequency semiconductor device.

Embodiment 7 of the present embodiment is described in reference to the cross-sectional view of the high-frequency semiconductor element shown in FIG. 9. The device of FIG. 9 differs from that according to Embodiment 2 shown in FIG. 3 in that the ceramic multilayer substrate 2 has a cavity portion 2a in its bottom surface, in which the semiconductor elements 1a, 1b, and 1c and the passive components are provided, and the electrodes 4 for connecting to the outside are formed on the ceramic multilayer substrate 2 at portions peripheral to the cavity portion 2a. The composite resin material layer 10 is formed in the cavity portion 2a, and the semiconductor elements 1a, 1b, and 1c and the passive components are buried in the composite resin material layer 10.

It should be noted that a metal wire can be employed to connect the semiconductor elements to the electrode pattern of the ceramic multilayer substrate 2. Also, the device of this embodiment can be structured without the heat release electrode 14 and the interlayer connector via holes 21. By adopting the cavity portion 2a as the portion in which the semiconductor elements and the passive components are provided, the composite resin material layer 10 is formed easily.

The invention may be embodied in other forms without departing from the spirit or essential characteristics thereof The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A high-frequency semiconductor device comprising:

a ceramic substrate;

an element group including semiconductor elements and passive components mounted onto a bottom portion of the ceramic substrate; and a composite resin material layer formed on a bottom surface of the ceramic substrate so as to bury the element group therein;

wherein the composite resin material layer is formed by a composite resin material including an epoxy resin and an inorganic filler material, the composite resin material layer has a planar shape corresponding to the shape of the ceramic substrate, and the composite resin material layer has a flat bottom surface ranging over the entire area of the bottom surface of the ceramic substrate, on which electrodes for connecting to the outside are formed and connected to conducting resin buried in respective via holes formed in the composite resin material layer.

2. The high-frequency semiconductor device according to claim 1, wherein the semi conductor elements are mounted by flip-chip connection.

3. The high-frequency semiconductor device according to claim 2, wherein interlayer connector structures are formed in the composite resin material layer, the interlayer connector structures being filled with a high thermal conductivity resin material having thermal conductivity higher than that of the epoxy resin, the electrodes for connecting to the outside include a ground electrode that functions as a heat release electrode, and a surface of the semiconductor elements is connected to the ground electrode via the interlayer connector structures.

* * * * *